United States Patent
Elschner et al.

(10) Patent No.: US 7,938,986 B2
(45) Date of Patent: May 10, 2011

(54) TRANSPARENT POLYMERIC ELECTRODES FOR ELECTRO-OPTICAL STRUCTURES, PROCESSES FOR PRODUCING THE SAME, AND DISPERSIONS USED IN SUCH PROCESSES

(75) Inventors: Andreas Elschner, Mülheim (DE); Peter Wilfried Loevenich, Köln (DE); Friedrich Jonas, Aachen (DE)

(73) Assignee: H.C. Starck GmbH & Co. KG, Goslar (DE)

( * ) Notice: Subject to any disclaimer, the term of this patent is extended or adjusted under 35 U.S.C. 154(b) by 163 days.

(21) Appl. No.: 11/637,411

(22) Filed: Dec. 12, 2006

(65) Prior Publication Data

US 2007/0131914 A1 Jun. 14, 2007

(30) Foreign Application Priority Data

Dec. 14, 2005 (DE) .................. 10 2005 060 159

(51) Int. Cl.
*H01B 1/12* (2006.01)
(52) U.S. Cl. ..................... 252/500; 528/377
(58) Field of Classification Search .................. 252/500; 528/377, 378
See application file for complete search history.

(56) References Cited

U.S. PATENT DOCUMENTS

| | | | |
|---|---|---|---|
| 5,300,575 A | 4/1994 | Jonas et al. | |
| 5,719,467 A | 2/1998 | Antoniadis et al. | |
| 5,766,515 A | 6/1998 | Jonas et al. | |
| 6,083,635 A | 7/2000 | Jonas et al. | |
| 6,358,437 B1 * | 3/2002 | Jonas et al. ................... | 252/500 |
| 6,887,556 B2 * | 5/2005 | Lamotte et al. ............... | 428/141 |
| 7,053,174 B2 * | 5/2006 | Kirchmeyer et al. ......... | 528/377 |
| 2002/0077450 A1* | 6/2002 | Kirchmeyer et al. ......... | 528/373 |
| 2002/0136923 A1 | 9/2002 | Jonas et al. | |
| 2004/0260016 A1 | 12/2004 | Louwet et al. | |
| 2005/0053801 A1 | 3/2005 | Elschner et al. | |

FOREIGN PATENT DOCUMENTS

| | | |
|---|---|---|
| DE | 10103416 A1 | 8/2002 |
| DE | 10335727 A1 | 2/2005 |
| EP | 0 440 957 | 8/1991 |
| EP | 0 686 662 | 12/1995 |
| WO | WO-96/08047 | 3/1996 |
| WO | WO-2004/114326 A1 | 12/2004 |

OTHER PUBLICATIONS

Elschner et al "High-Resistivity PEDT/PSS for Reduced Crosstalk in Passive Matrix OELs", OEL3-3, Asia Display/IDW '01 (2001) pp. 1427-1430.*
Halls, et al., "Efficient photodiodes from Interpenetrating polymer networks," *Nature*, Aug. 10, 1995, vol. 376, pp. 498-500.
Shirota, et al., "Multilayered organic electroluminescent device using a novel starburst molecule, 4,4',4"-tris(3-methylphenylphenylamino)triphenylamine, as a hole transport material," *Appl. Phys. Lett.*, Aug. 1994, vol. 65, No. 7, pp. 807-809.
Sheats, et al., "Organic Electroluminescent Devices," *Science*, Aug. 16, 1996, vol. 273, pp. 884.888.

(Continued)

*Primary Examiner* — Mark Kopec
(74) *Attorney, Agent, or Firm* — Connolly Bove Lodge & Hutz LLP (57) ABSTRACT

The invention concerns a process for producing transparent multi-layer electrodes from conductive polymers, electrodes produced by this process and their use in electro-optical structures.

4 Claims, 1 Drawing Sheet

OTHER PUBLICATIONS

Van Slyke, et al., "Organic electroluminescent devices with improved stability," *Appl. Phys. Lett*, Oct. 7, 1996, vol. 69, No. 15, pp. 2160-2162.

Gustafsson, et al., "Flexible light-emitting diodes made from soluble conducting polymers," *Nature*, Jun. 11, 1992, vol. 357, pp. 477-479.

Müller, "Determination of very broad particle size distributions via interference optics in the analytical ultracentrifuge," *Progr Colloid Polym Sci*, (2004), vol. 127, pp. 9-13.

Pfeiffer, et al., "Electrophosphorescent p-i-n Organic Light-Emitting Devices for Very-High-Efficiency Flat-Panel Displays," *Adv. Mater.*, Nov. 18, 2002, vol. 14, No. 22, pp. 1633-1636.

Zhang, et al., "Polymer Photovoltaic Cells with Conducting Polymer Anodes," *Adv. Mater.*, May 3, 2002, vol. 14, No. 3, pp. 662-665.

Lee, et al., "Thickness effects of conducting polymer as an ITO replacement on electroluminescent devices," *Thin Solid Films*, (2000), vol. 363, pp. 225-228.

Kim, et al., "Spin-cast thin semiconducting polymer interlayer for improving device efficiency of polymer light-emitting diodes," *Applied Physics Letters*, (2005), vol. 87, pp. 023506.1-023506.3.

Kim, et al., "Molecular organic light-emitting diodes using highly conducting polymers as anodes," *Applied Physics Letters*, May 20, 2002, vol. 80, No. 20, pp. 3844-3846.

Hung, et al., "Anode modification in organic light-emitting diodes by low-frequency plasma polymerization of $CHF_3$," *Applied Physics Letters*, Jan. 29, 2001, vol. 78, No. 5, pp. 673-675.

Schröder, "Polymere aus 3-Oxo-1-buten sind weiterhin zugänglich durch," *Makromolekulare Stoffe*, 1987, vol. E 20, pp. 1141-1176.

Elschner, et al., "High-Resistivity PEDT/PSS for Reduced Crosstalk in Pasive Matrix OELs," *Asia Display*, 2001, pp. 1427-1430.

"Standard Test Method for Haze and Luminous Transmittance of Transparent Plastics," ASTM Designation: D 1003-00 (2000).

"Standard Practice for Computing the colors of Objects by Using the CIE System," ASTM Designation: E 308-94a.

"Measurement of resistivity of conductive plastics," DIN EN ISO 3915.

Fukase, et al., "High-efficiency Organic Electroluminescent Devices Using Iridium Complex Emitter and Arylamine-containing Polymer Buffer Layer," *Polym. Adv. Technol.*, (2002), vol. 13, pp. 601-604.

Baytron® P V AP AI 4083 & Baytron® P VP CH 8000, "Product Information for Electronic Grades Designed for Use as Hole-Injection Material in OLEDs," 4 pages (May 2001).

Blanchard, et al., "Thieno[3,4-b]-1,4-oxathiane: An Unsymmetrical Sulfar Analogue of 3,4-Ethylenedioxythiophene (EDOT) as a Building Block for Linear pi-Conjugated Systems," *Organic Letters*, vol. 4, No. 4, pp. 607-609, 2002.

European Search Report, 8 pages, Jun. 18, 2010.

First Office Action, State Intellectual Property Office, P.R. China, 11 pages, Aug. 28, 2009.

Lee, et al., "Poly(thieno[3,4-b]thiophene)-Poly(Styrene sulfonate): A Low Band Gap, Water Dispersible Conjugated Polymer," *Langmuir*, vol. 21, pp. 10797-10802, 2005.

Second Office Action, State Intellectual Property Office, P.R. China, 7 pages, Jun. 10, 2010.

\* cited by examiner

TRANSPARENT POLYMERIC ELECTRODES FOR ELECTRO-OPTICAL STRUCTURES, PROCESSES FOR PRODUCING THE SAME, AND DISPERSIONS USED IN SUCH PROCESSES

BACKGROUND OF THE INVENTION

Owing to their particular properties, displays based on organic light-emitting diodes (OLEDs) are an alternative to the established technology of liquid crystals (LCD). This novel technology offers advantages in particular in applications involving portable devices which are not plugged into the mains supply, such as mobile telephones, pagers and toys, for example.

The advantages of OLEDs include the extremely flat design, the property of generating their own light, which means that like liquid crystal displays (LCDs) they require no additional light source, the high luminous efficiency and the unrestricted viewing angle.

In addition to displays, however, OLEDs can also be used for lighting purposes, for example in large-area radiation emitters. Due to their extremely flat design, they can be used to build very thin lighting elements, which hitherto was not possible. The luminous efficiencies of OLEDs now exceed those of thermal radiation emitters, such as incandescent bulbs for example, and the emission spectrum can in principle be varied as desired through a suitable choice of emitter materials.

Neither OLED displays nor OLED lighting elements are limited to a flat, rigid design. Arrangements that are flexible or curved in any way are just as feasible owing to the flexibility of the organic functional layers.

An advantage of organic light-emitting diodes lies in their simple structure. This structure is conventionally as follows: a transparent electrode is applied to a transparent support, e.g. glass or plastic film. On top of this is at least one organic layer (emitter layer) or a stack of organic layers applied in succession. Finally a metal electrode is applied.

Organic solar cells (OSCs) have the same structure in principle (Halls et al., Nature 1995, 376, 498), except that in this case, conversely, light is converted into electrical energy.

The economic success of these novel electro-optical structures will depend not only on fulfilment of the technical requirements but substantially also on manufacturing costs. Simplified process steps leading to a reduction in manufacturing complexity and manufacturing costs are therefore of great importance.

TCO (transparent conducting oxide) layers such as indium-tin oxide (ITO) or antimony-tin oxide (ATO) or thin metal layers have hitherto conventionally been used as transparent electrodes in OLEDs or OSCs. The deposition of these inorganic layers takes place by sputtering, reactive surface atomisation (reactive sputtering) or thermal evaporation of the organic material in vacuo and is therefore complex and cost-intensive.

ITO layers are a substantial cost factor in the production of OLEDs or OSCs. ITO layers are used because they combine high electrical conductivity with high transparency. However, ITO has the following considerable disadvantages:

a) ITO can only be deposited in a complex, cost-intensive vacuum process (by reactive sputtering).

b) Temperatures of T>400° C. are necessary in the deposition process if high conductivities are to be obtained. In particular, the polymer substrates which are important for flexible displays do not withstand these temperatures.

c) ITO is brittle and forms cracks when shaped.

d) The metal indium is a raw material with only limited production, and supply shortages are predicted if consumption increases further.

e) The environmentally compatible disposal of electro-optical structures containing the heavy metal indium is a problem which has yet to be solved.

Despite these disadvantages, ITO layers are still used because of their favourable ratio of electrical conductivity to optical absorption and above all due to the lack of suitable alternatives. A high electrical conductivity is necessary to keep down the voltage drop across the transparent electrode in current-driven structures.

Alternatives to ITO as electrode materials have been discussed in the past, but hitherto no alternatives have been found which do not exhibit the disadvantages described above and which at the same time offer comparably good properties in electro-optical structures.

Thus a polymeric ITO substitute in which monomers are polymerised in situ on a substrate to form conductive layers has been described, such as e.g. in-situ polymerised poly(3, 4-ethylenedioxy)thiophene, which is also abbreviated by specialists to in-situ-PEDT (WO-A 96/08047). However, as well as being likewise difficult to process on the substrate, these in-situ-PEDT layers have the disadvantage, particularly for applications in OLEDs, that firstly the material has a strong inherent colour and secondly that the electroluminescence efficiencies that can be achieved with it are low.

In addition, a complex of polyethylenedioxythiophene and polystyrene sulfonic acid, abbreviated by specialists to PEDT/PSA or PEDT:PSA, has been proposed as a polymeric ITO substitute (EP-A 686 662, Inganäs et al., Adv. Mater. 2002, 14, 662-665; Lee et al., Thin Solid Films 2000, 363, 225-228; W. H. Kim et al., Appl. Phys. Lett. 2002, Vol. 80, No. 20, 3844-3846). However, the conductivity of PEDT:PSA layers produced from formulations having a PEDT:PSA ratio such as 1:2.5 (percent by weight) is not particularly high, e.g. approx. 0.1 S/cm for an aqueous PEDT/PSA dispersion (available commercially as Baytron® P from H.C. Starck), and far removed from the desired value for ITO of 5000 to 10,000 S/cm. Although the conductivity can be raised to approx. 50 S/cm by adding additives such as e.g. dimethyl sulfoxide, N-methyl pyrrolidone, sorbitol, ethylene glycol or glycerol to such an aqueous PEDT/PSA dispersion, it is still well below the value for ITO. Furthermore, the fact that these formulations lead to relatively rough layer surfaces because of their coarse particle structure argues against the use of these layers as an ITO substitute in many electro-optical applications. In particular, for applications which are sensitive to short-circuits due to surface roughness, such as OLEDs and OSCs, these layers are thus not very suitable.

There was therefore still a requirement for a suitable substitute material for ITO which does not exhibit the disadvantages of ITO and at the same time offers equivalent properties in electrical or electro-optical structures.

BRIEF SUMMARY OF THE INVENTION

The object of the present invention was therefore to produce electrodes which can replace the conventional ITO electrodes without however exhibiting the aforementioned disadvantages.

The invention concerns a process for producing transparent multi-layer electrodes from conductive polymers, electrodes produced by this process and their use in electro-optical structures.

Surprisingly it has been found that electrodes consisting of at least two electrode layers, wherein the first electrode layer was produced from a polythiophene dispersion in which 50 wt. % of the particles are smaller than 50 nm and was applied to a second layer containing a hole-injecting material, satisfy these requirements.

The present invention thus provides a process for producing an electrode containing at least two layers, characterised in that:

a first layer is produced by applying a dispersion containing at least one polymeric anion and at least one optionally substituted polythiophene containing repeating units having the general formula (I), (I)

wherein A stands for an optionally substituted $C_1$ to $C_5$ alkylene radical, preferably for an optionally substituted $C_2$ to $C_3$ alkylene radical, R stands for a linear or branched, optionally substituted $C_1$ to $C_{18}$ alkyl radical, an optionally substituted $C_5$ to $C_{12}$ cycloalkyl radical, an optionally substituted $C_6$ to $C_{14}$ aryl radical, an optionally substituted $C_7$ to $C_{18}$ aralkyl radical, an optionally substituted $C_1$ to $C_4$ hydroxyalkyl radical or a hydroxyl radical, x stands for a whole number from 0 to 8, preferably for 0 or 1, and if several radicals R are bound to A, they can be the same or different, and 50 wt. % of the particles in the dispersion are smaller than 50 nm, to a suitable substrate and then allowing it to solidify, and then a second layer is produced by applying at least one organic hole-injecting material and optionally at least one anion (from solution or dispersion or by physical vapour deposition) to the first layer and optionally then allowing it to solidify.

The general formula (I) should be understood to mean that x substituents R can be bound to the alkylene radical A.

BRIEF DESCRIPTION OF THE SEVERAL VIEWS OF THE DRAWING

The foregoing summary, as well as the following detailed description of the invention, may be better understood when read in conjunction with the appended drawings. For the purpose of illustrating the invention, there are shown in the drawings certain embodiments which may presently be preferred. It should be understood, however, that the invention is not limited to the precise arrangements and instrumentalities shown.

In the drawings.

DETAILED DESCRIPTION OF THE INVENTION

Polythiophenes containing repeating units having the general formula (I) are preferably examples containing repeating units having the general formula (Ia), (Ia)

wherein R and x have the meaning given above.

The polythiophenes are particularly preferably examples containing repeating units having the general formula (Iaa)

(Iaa)

In preferred embodiments of the process according to the invention the polythiophenes are examples consisting of repeating units having the general formulae (I), preferably the general formulae (Ia) and particularly preferably the general formulae (Iaa).

Within the meaning of the invention the prefix poly should be understood to mean that more than one identical or different repeating unit is contained in the polymer or polythiophene. The polythiophenes contain a total of n repeating units having the general formula (I), wherein in particular n can be a whole number from 2 to 2000, preferably 2 to 100. Within a polythiophene the repeating units having the general formula (I) can be the same or different. Polythiophenes are preferred which have identical repeating units having the general formula (I), preferably having the general formulae (Ia) and particularly preferably having the general formulae (Iaa).

The polythiophenes preferably each carry H at the terminal groups.

In a particularly preferred embodiment, the polythiophene with repeating units having the general formula (I) is poly(3,4-ethylenedioxythiophene), i.e. a homopolythiophene consisting of repeating units having the formula (Iaa).

The dispersion for producing the first layer is preferably one in which 50 wt. % of the particles are smaller than 40 nm, preferably smaller than 30 nm.

The particle size distribution is determined with an analytical ultracentrifuge, as described in H. G. Müller; Progr. Colloid Polym. Sci. 127 (2004) 9-13.

One or more additives which increase conductivity are particularly preferably added to the dispersion for producing the first layer, such as e.g. ether group-containing compounds, such as e.g. tetrahydrofuran, lactone group-containing compounds such as γ-butyrolactone, γ-valerolactone, amide or lactam group-containing compounds such as caprolactam, N-methyl caprolactam, N,N-dimethyl acetamide, N-methyl acetamide, N,N-dimethyl formamide (DMF), N-methyl formamide, N-methyl formanilide, N-methylpyrrolidone (NMP), N-octyl pyrrolidone, pyrrolidone, sulfones and sulfoxides, such as e.g. sulfolane (tetramethylene sulfone), dimethyl sulfoxide (DMSO), sugars or sugar derivatives such as e.g. sucrose, glucose, fructose, lactose, sugar alcohols such as e.g. sorbitol, mannitol, furan derivatives such as e.g. 2-furan carboxylic acid, 3-furan carboxylic acid, and/or dialcohols or polyalcohols, such as e.g. ethylene glycol, glycerol, diethylene or triethylene glycol. Tetrahydrofuran, N-methyl formamide, N-methylpyrrolidone, dimethyl sulfoxide or sorbitol are preferably used as conductivity-increasing additives. Dimethyl sulfoxide is particularly preferred. The additives are preferably added to the dispersions for producing the first layer in an amount of at least 0.1 wt. %, preferably at least 0.5 wt. %, particularly preferably at least 1 wt. %, based on the total weight of the dispersion.

The organic hole-injecting material can be a polymeric or low-molecular-weight material, the latter also being referred to in professional circles as a small-molecule material. Suitable examples of polymeric hole-injecting materials include polythiophenes, polyanilines, such as polyaniline/camphor sulfonic acid (PANI-CSA) (G. Gustafsson et al., Nature 357 (1992) 477), polyphenylamines, such as poly(arylene ether sulfones) containing tetraphenyl diamine and doped with tris (4-bromophenyl)aminium hexachloroantimonate (PTPDES: TBPAH) (A. Fukase et al., Polym. Adv. Technol. 13 (2002) 601) or poly(2,7-(9,9-di-n-octylfluorene)-alt-(1,4-phenylene-((4-sec-butylphenyl)imino)-1,4-phenylene)) (TFB) (J. S. Kim et al., Appl. Phys. Lett. 87 (2005) 23506), fluorinated polymers (L. S. Hung, Appl. Phys. Lett. 78 (2001) 673) and blends of these compounds.

Preferred polymeric, hole-injecting materials are optionally substituted polythiophenes containing repeating units having the general formula (II-a) and/or (II-b), (II-a)

(II-b)

wherein A stands for an optionally substituted $C_1$ to $C_5$ alkylene radical, preferably for an optionally substituted $C_2$ to $C_3$ alkylene radical, Y stands for O or S, R stands for a linear or branched, optionally substituted $C_1$ to $C_{18}$ alkyl radical, an optionally substituted $C_5$ to $C_{12}$ cycloalkyl radical, an optionally substituted $C_6$ to $C_{14}$ aryl radical, an optionally substituted $C_7$ to $C_{18}$ aralkyl radical, an optionally substituted $C_1$ to $C_4$ hydroxyalkyl radical or a hydroxyl radical, x stands for a whole number from 0 to 8, preferably for 0 or 1, and if several radicals R are bound to A, they can be the same or different, optionally also containing at least one polymeric anion.

Polythiophenes containing repeating units having the general formula (II-a) are preferably examples containing repeating units having the general formula (II-a-1) and/or (II-a-2), (II-a-1)

(II-a-2)

wherein R and x have the meaning given above.

They are particularly preferably polythiophenes containing repeating units having the general formula (II-aa-1) and/or (II-aa-2)

(II-aa-1)

(II-aa-2)

In particularly preferred embodiments, the polythiophene with repeating units having the general formula (II-a) and/or (II-b) is poly(3,4-ethylenedioxythiophene), poly(3,4-ethyleneoxythiathiophene) or poly(thieno[3,4-b]thiophene, in other words a homopolythiophene consisting of repeating units having the formula (II-aa-1), (II-aa-2) or (II-b).

In further particularly preferred embodiments the polythiophene with repeating units having the general formula (II-a) and/or (II-b) is a copolymer consisting of repeating units having the formula (II-aa-1) and (II-aa-2), (II-aa-1)and (II-b), (II-aa-2) and (II-b) or (II-aa-1), (II-aa-2) and (II-b), copolymers consisting of repeating units having the formula (II-aa-1) and (II-aa-2) as well as (II-aa-1) and (II-b) being preferred.

Within the meaning of the invention, $C_1$ to $C_5$ alkylene radicals A are: methylene, ethylene, n-propylene, n-butylene or n-pentylene. $C_1$ to $C_{18}$ alkyl within the meaning of the invention stands for linear or branched $C_1$ to $C_{18}$ alkyl radicals such as, for example, methyl, ethyl, n-propyl or isopropyl, n-, iso-, sec- or tert-butyl, n-pentyl, 1-methylbutyl, 2-methylbutyl, 3-methylbutyl, 1-ethylpropyl, 1,1-dimethylpropyl, 1,2-dimethylpropyl, 2,2-dimethylpropyl, n-hexyl, n-heptyl, n-octyl, 2-ethylhexyl, n-nonyl, n-decyl, n-undecyl, n-dodecyl, n-tridecyl, n-tetradecyl, n-hexadecyl or n-octadecyl, $C_5$ to $C_{12}$ cycloalkyl for $C_5$ to $C_{12}$ cycloalkyl radicals, such as cyclopentyl, cyclohexyl, cycloheptyl, cyclooctyl, cyclononyl or cyclodecyl, $C_5$ to $C_{14}$ aryl for $C_6$ to $C_{14}$ aryl radicals such as phenyl or naphthyl, and $C_7$ to $C_{18}$ aralkyl for $C_7$ to $C_{18}$ aralkyl radicals such as, for example, benzyl, o-, m-, p-tolyl, 2,3-, 2,4-, 2,5-, 2,6-, 3,4-, 3,5-xylyl or mesityl. The above list serves to illustrate the invention by way of example and should not be regarded as exhaustive.

Numerous organic groups are suitable as optionally further substituents of the $C_1$ to $C_5$ alkylene radicals A, for example alkyl, cycloalkyl, aryl, halogen, ether, thioether, disulfide, sulfoxide, sulfone, sulfonate, amino, aldehyde, keto, carboxylic acid ester, carboxylic acid, carbonate, carboxylate, cyano, alkyl silane and alkoxy silane groups and carboxylamide groups.

Preferred polymeric anions are, for example, anions of polymeric carboxylic acids, such as polyacrylic acids, polymethacrylic acid or polymaleic acids, or polymeric sulfonic acids, such as polystyrene sulfonic acids and polyvinyl sulfonic acids. These polycarboxylic and polysulfonic acids can also be copolymers of vinyl carboxylic and vinyl sulfonic acids with other polymerisable monomers, such as acrylic acid esters and styrene.

The anion of polystyrene sulfonic acid (PSA) as a counterion is particularly preferred as the polymeric anion.

In addition to those mentioned above, partially fluorinated or perfluorinated polymers containing $SO_3^-M^+$ or $COO^-M^+$ groups are also suitable as polymeric anions for the second electrode layer, particularly in combination with the polythiophenes containing repeating units having the general formulae (II-a) and/or (II-b). Such a partially fluorinated or perfluorinated polymer containing $SO_3^-M^+$ or $COO^-M^+$ groups can be Nafion®, for example, which is commercially available. A mixture of anions of polystyrene sulfonic acid (PSA) and Nafion® is also suitable as polymeric anions for the second electrode layer.

The molecular weight of the polyacids delivering the polyanions is preferably 1000 to 2,000,000, particularly preferably 2000 to 500,000. The polyacids or their alkali salts are commercially available, e.g. polystyrene sulfonic acids and polyacrylic acids, or are obtainable by known methods (see e.g. Houben Weyl, Methoden der organischen Chemie, Vol. E 20 Makromolekulare Stoffe, Part 2 (1987), p. 1141 ff.).

The polythiophenes can be neutral or cationic. In preferred embodiments they are cationic, "cationic" referring only to the charges located on the polythiophene main chain. Depending on the substituent on the radicals R, the polythiophenes can carry positive and negative charges in the structural unit, the positive charges being located on the polythiophene main chain and the negative charges optionally on the radicals R substituted by sulfonate or carboxylate groups. In this case the positive charges of the polythiophene main chain can be partially or wholly saturated with the optionally present anionic groups on the radicals R. Considered as a whole, the polythiophenes can in these cases be cationic, neutral or even anionic. Nevertheless, within the meaning of the invention they are all regarded as cationic polythiophenes, since the positive charges on the polythiophene main chain are definitive. The positive charges are not shown in the formulae as their exact number and position cannot be definitively established. However, the number of positive charges is at least 1 and at most n, n being the total number of all repeating units (identical or different) within the polythiophene.

To compensate for the positive charge, if this has not already occurred as a result of the optionally sulfonate- or carboxylate-substituted and hence negatively charged radicals R, the cationic polythiophenes require anions as counterions.

Counterions can be monomeric or polymeric anions, the latter also being referred to hereafter as polyanions.

Polymeric anions can be those already listed above. Suitable monomeric anions are, for example, those of $C_1$ to $C_{20}$ alkane sulfonic acids, such as methane, ethane, propane, butane or higher sulfonic acids, such as dodecane sulfonic acid, of aliphatic perfluorosulfonic acids, such as trifluoromethane sulfonic acid, perfluorobutane sulfonic acid or perfluorooctane sulfonic acid, of aliphatic $C_1$ to $C_{20}$ carboxylic acids such as 2-ethylhexyl carboxylic acid, of aliphatic perfluorocarboxylic acids, such as trifluoroacetic acid or perfluorooctanoic acid, and of aromatic sulfonic acids optionally substituted by $C_1$ to $C_{20}$ alkyl groups, such as benzene sulfonic acid, o-toluene sulfonic acid, p-toluene sulfonic acid or dodecylbenzene sulfonic acid and of cycloalkane sulfonic acids such as camphor sulfonic acid or tetrafluoroborates, hexafluorophosphates, perchlorates, hexafluoroantimonates, hexafluoroarsenates or hexachloroantimonates.

The anions of p-toluene sulfonic acid, methane sulfonic acid or camphor sulfonic acid are particularly preferred.

Cationic polythiophenes which contain anions as counterions for charge compensation are often also referred to by specialists as polythiophene/(poly)anion complexes.

In the layers containing at least one polymeric anion and at least one polythiophene with repeating units having the general formula (I) or (II-a) and/or (II-b), the polymeric anion can function as a counterion. However, additional counterions can also be contained in the layer. The polymeric anion preferably serves as the counterion in this layer, however.

Polymeric anion(s) and polythiophene(s) can be contained in the first layer in a ratio by weight of 0.5:1 to 20:1, preferably 1:1 to 5:1. Polymeric anion(s) and polythiophene(s) can be contained in the second layer in a ratio by weight of 0.5:1 to 50:1, preferably 1:1 to 30:1, particularly preferably 2:1 to 20:1. The weight of the polythiophenes corresponds here to the weighed-in amount of the monomers used, assuming that a complete conversion takes place during polymerisation.

In preferred embodiments the first layer is produced from a dispersion containing a polyanion and a polythiophene with repeating units having the general formula (I), in which R, A and x have the above meaning, to which is applied a second layer from a dispersion containing a polymeric anion and a polythiophene with repeating units having the general formula (II-a) and/or (II-b).

In a most particularly preferred embodiment, the first layer is produced from a dispersion containing polystyrene sulfonic acid and poly(3,4-ethylenedioxythiophene), to which is applied a second layer from a dispersion containing polystyrene sulfonic acid and poly(3,4-ethylenedioxythiophene), also referred to in professional circles as PEDT/PSA or PEDT:PSA.

The dispersions—both for producing the first and for producing the second electrode layer—can also contain one or more solvents. Examples of suitable solvents are aliphatic alcohols such as methanol, ethanol, i-propanol and butanol, aliphatic ketones such as acetone and methyl ethyl ketone, aliphatic carboxylic acid esters such as acetic acid ethyl ester and acetic acid butyl ester, aromatic hydrocarbons such as toluene and xylene; aliphatic hydrocarbons such as hexane, heptane and cyclohexane, chlorinated hydrocarbons such as dichloromethane and dichloroethane, aliphatic nitrites such as acetonitrile, aliphatic sulfoxides and sulfones such as dimethyl sulfoxide and sulfolane, aliphatic carboxylic acids amides such as methyl acetamide, dimethyl acetamide and dimethyl formamide, aliphatic and araliphatic ethers such as diethyl ether and anisole. Water or a mixture of water and the aforementioned organic solvents can also be used as the solvent. Preferred solvents are water or other protic solvents such as alcohols, e.g. methanol, ethanol, i-propanol and butanol, and mixtures of water with these alcohols; the particularly preferred solvent is water.

If the dispersions contain one or more solvents, the solids content in these dispersions is preferably 0.01% to 20%, particularly preferably 0.1% to 10%, based on the total weight of the dispersion.

The dispersions for producing the first electrode layer preferably have a viscosity of 5 to 300 mPas, preferably 10 to 100 mPas. The dispersions for producing the second electrode layer preferably have a viscosity of 2 to 300 mPas, preferably 5 to 100 mPas.

The viscosity of the solutions examined here is measured with a Haake RV 1 rheometer with thermostat. In the clean and dry measuring beakers 13.5 g±0.3 g of the solutions to be measured are weighed into the measuring slit and measured at a shear rate of 100 s$^{-1}$ at 20.0° C.

Further components can also be added to the dispersions for producing the second electrode layer, such as one or more organic binders that are soluble in organic solvents, such as polyvinyl acetate, polycarbonate, polyvinyl butyral, polyacrylic acid esters, polymethacrylic acid esters, polystyrene, polyacrylonitrile, polyvinyl chloride, polybutadiene, polyisoprene, polyethers, polyesters, silicones, styrene/acrylic acid ester, vinyl acetate/acrylic acid ester and ethylene/vinyl acetate copolymers, water-soluble binders such as polyvinyl alcohols and/or crosslinkers such as polyurethanes or polyurethane dispersions, polyacrylates, polyolefin dispersions, epoxy silanes, such as 3-glycidoxypropyl trialkoxysilane.

The dispersions are applied to the suitable substrate or to the first layer by known methods, e.g. by spin coating, impregnation, pouring, dropwise application, atomising, spraying, knife application, brushing or printing, for example inkjet, gravure, screen, flexographic or pad printing.

Application of the first and second layer containing at least one polymeric anion and at least one polythiophene with repeating units having the general formula (I) or (II-a) and/or (II-b) can be followed after solidification—by drying for example—by cleaning the layer—for example by washing.

Production of the dispersion from thiophenes having the general formula (II) takes place for example in an analogous manner to the conditions cited in EP-A 440 957. To obtain these particle sizes the dispersion is preferably homogenised once or more, optionally at elevated pressure, in the manner likewise known to the person skilled in the art to produce the first layer. The solids content can be adjusted in advance in the desired manner through the choice of the amounts of solvent that is optionally present or reduced by dilution or increased by concentration in the known manner afterwards.

Production of the polythiophene/polyanion complex and subsequent dispersion or redispersion in one or more solvents is also possible.

The first layer is solidified before the second layer is applied, in the case of solvent-containing dispersions in particular by removing the solvent or by oxidative crosslinking, preferably by exposing the dispersion layer to (ambient) oxygen.

The solvent that is optionally present can be removed after application of the solutions by simple evaporation at room temperature. To obtain faster processing speeds, however, it is more advantageous to remove the solvents at elevated temperatures, e.g. at temperatures of 20 to 300° C., preferably 40 to 200° C. Depending on the additive in the dispersion for producing the first electrode layer, its drying temperature can particularly preferably be chosen as 100 to 150° C. A thermal post-treatment can be carried out immediately, allied to the removal of the solvent, or some time after the production of the coating. Depending on the nature of the polymer used for the coating, the heat treatment can last from 5 seconds to several hours. Temperature profiles with differing temperatures and residence times can also be used for the thermal treatment.

The heat treatment can be performed by, for example, moving the coated substrates through a heated chamber at the desired temperature at a rate such that the desired residence time at the chosen temperature is achieved, or by bringing it into contact with a hot plate at the desired temperature for the desired residence time. The heat treatment can also take place in a heating oven or in several heating ovens, for example, each at different temperatures.

The substrate can be glass, extremely thin glass (flexible glass) or plastics, for example. Before application of the layer containing at least one conductive polymer, the substrate can be treated with an adhesion promoter. Such a treatment can take place by, for example, spin coating, impregnation, pouring, dropwise application, atomising, spraying, knife application, brushing or printing, for example inkjet, gravure, screen, flexographic or pad printing.

Particularly suitable plastics for the substrate are: polycarbonates, polyesters, such as e.g. PET and PEN (polyethylene terephthalate and polyethylene naphthalene dicarboxylate respectively), copolycarbonates, polysulfone, polyether sulfone (PES), polyimide, polyethylene, polypropylene or cyclic polyolefins or cyclic olefin copolymers (COC), hydrogenated styrene polymers or hydrogenated styrene copolymers.

Suitable polymer substrates can be films, for example, such as polyester films, PES films from Sumitomo or polycarbonate films from Bayer AG (Makrofol®).

Preferred low-molecular-weight hole-injecting materials are optionally substituted phthalocyanines, such as Cu phthalocyanine (S. A. Van Slyke et al., Appl. Phys. Lett. 69 (1996) 2160) or optionally substituted phenylamines such as 4,4'-bis (3methylphenylphenylamino) biphenyl (TPD) or 4,4',4"-tris (3-methylphenyl-phenylamino) triphenylamine(m-MT-DATA) (Y. Shirota et al., Appl. Phys. Lett. 65 (1994) 807), which can optionally also be doped with 2,3,5,6-tetrafluoro-7,7,8,8-tetracyanoquinodimethane (F4-TCNQ) or other donors or acceptors (M. Pfeiffer et al., Adv. Mat. 14 (2002) 1633).

Depending on the hole-injecting material, the second layer of the electrode according to the invention can be applied from solution, dispersion or from the gas phase. The second layer is preferably produced from solution or dispersion. In preferred embodiments of the process according to the invention, the second layer is produced from a dispersion containing at least one polymeric anion and at least one optionally substituted polythiophene containing repeating units having the general formula (II-a) and/or (II-b).

The process according to the invention can thus preferably be performed without the need for complex and expensive physical vapour deposition or sputtering processes. This also allows inter alia application on large surfaces. Furthermore, the polythiophene/polyanion layers can be applied at low temperatures, preferably room temperature. The process according to the invention is thus also suitable for application on polymeric, flexible substrates, which generally tolerate only low-temperature processes and cannot withstand the temperatures for ITO deposition.

The present invention also provides electrodes which can be produced and preferably were produced by means of the process according to the invention.

The electrodes according to the invention are preferably transparent electrodes. Transparent within the meaning of the invention means transparent for visible light.

The standard colour value Y of the first layer of the electrode according to the invention is preferably at least Y(D65/10°)=50, particularly preferably at least Y(D65/10°)=70.

The luminous transmittance is measured according to the wavelength in accordance with ASTM D 1003 and used to calculate the standard colour value Y—often also referred to as brightness—in accordance with ASTM E308. For a completely transparent sample Y=100, for an opaque sample Y=0. In light engineering terms, Y(D65/10°) is understood to be the standard colour value calculated using the standard light type D65 observed at an angle of 10° (cf. ASTM E308). The stated standard colour values refer to the pure layer, i.e. an uncoated substrate is also measured as a control.

The first layer of the electrode according to the invention preferably has an electrical conductivity of at least 300 Scm⁻¹, particularly preferably at least 400 Scm⁻¹.

Electrical conductivity is understood to be the reciprocal of the specific resistance. This is calculated from the product of the surface resistance and film thickness of the conductive polymer layer. The surface resistance for conductive polymers is measured in accordance with DIN EN ISO 3915, the thickness of the polymer layer using a stylus profilometer.

Furthermore, the first layer of the electrode according to the invention preferably exhibits a surface roughness Ra of less than 2.5 nm, preferably less than 1.5 nm.

The surface roughness Ra is measured using a scanning force microscope (Digital Instruments) by scanning a 1 µm by 1 µm area of an approx. 150 nm thick polymer layer on glass substrates.

The surface roughness of the first layer of the electrode according to the invention is advantageously markedly less than that of the electrodes known from EP-A 686 662, for example, so that the short-circuit probability for OLEDs and OSCs is reduced with the electrodes according to the invention.

The first layer of the electrode according to the invention also preferably has a dry film thickness of 10 to 500 nm, particularly preferably 20 to 200 nm, most particularly preferably 50 to 200 nm. The second layer of the electrode according to the invention preferably has a dry film thickness of 5 to 300 nm, particularly preferably 10 to 200 nm, particularly preferably 50 to 150 nm.

In preferred embodiments the electrode contains a first layer consisting of a polyanion and a polythiophene with repeating units having the general formula (I), in which R, A and x have the meaning given above, to which is applied a second layer consisting of a polymeric anion and a polythiophene with repeating units having the general formula (II-a) and/or (II-b).

In a most particularly preferred embodiment, the electrode contains a first layer consisting of polystyrene sulfonic acid and poly(3,4-ethylenedioxythiophene), to which is applied a second layer consisting of polystyrene sulfonic acid and poly (3,4-ethylenedioxythiophene), also referred to in professional circles as PEDT/PSA or PEDT:PSA.

The electrodes according to the invention are extremely suitable as electrodes in electrical and preferably in electro-optical structures, particularly in organic light-emitting diodes (OLEDs), organic solar cells (OSCs), electrophoretic or liquid crystalline displays (LCDs) and optical sensors.

Electro-optical structures generally contain two electrodes, at least one of which is transparent, and an electro-optically active coating system between them. In the case of OLEDs, the electro-optical structure is an electroluminescent layer arrangement, also shortened hereafter to electroluminescent arrangement or EL arrangement.

The simplest case of such an EL arrangement consists of two electrodes, at least one of which is transparent, and an electro-optically active layer between these two electrodes. However, other functional layers can also be included in such an electroluminescent layer structure, such as e.g. other charge-injecting, charge-transporting or charge-blocking interlayers. Such layer structures are known to the person skilled in the art and described by way of example in (J. R. Sheats et al., Science 273 (1996), 884). One layer can also take on several tasks. In the simplest case of an EL arrangement described above the electro-optically active, i.e. usually light-emitting, layer can take on the functions of the other layers. One or both of the electrodes can be applied to a suitable substrate, i.e. a suitable support. The layer structure is then provided with appropriate contacts and optionally sheathed and/or encapsulated.

The structure of multi-layer systems can be obtained by physical vapour deposition (PVD), in which the layers are applied successively from the gas phase, or by casting methods. Physical vapour deposition is used in conjunction with the shadow mask method to make structured LEDs which use organic molecules as emitters. Owing to the higher process speeds and smaller amount of waste material that is produced, and the associated cost savings, casting processes are generally preferred.

As already described above, the electrodes according to the invention can advantageously be produced from solution/dispersion.

The present invention thus also provides an electroluminescent arrangement consisting of at least two electrodes, at least one of which is transparent, and an electro-optically active layer between the electrodes, characterised in that it contains an electrode according to the invention as the transparent electrode.

Preferred electroluminescent arrangements are ones which contain an electrode according to the invention applied to a suitable substrate, i.e. first and second layer, an emitter layer and a metal cathode. In such an EL arrangement, the layer containing at least one organic, hole-injecting material, preferably at least one polymeric anion and at least one polythiophene having the general formula (II-a) or (II-b), can function as the hole-injecting interlayer, for example. Other functional layers listed above can optionally be included.

In particular, the electrically conductive layer is placed in contact with several electrically highly conductive metallic leads as the anode.

A preferred embodiment of the present invention is an EL arrangement consisting of layers in the following sequence:

Substrate//(polyethylenedioxythiophene/polystyrene sulfonic acid) layer (first layer)//(polyethylenedioxythiophene/polystyrene sulfonic acid) layer (second layer)//emitter layer//metal cathode. Other functional layers can optionally be included.

Corresponding structures with an electrode according to the invention are also advantageous in inverted OLED or OSC structures, i.e. if the layers are assembled in the reverse sequence. A corresponding preferred embodiment of an inverted OLED is the following:

Substrate//metal cathode//emitter layer//(polyethylenedioxythiophene/polystyrene sulfonic acid) layer (second layer)//(polyethylenedioxythiophene/polystyrene sulfonic acid) layer (first layer).

Inverted OLEDs, particularly in combination with active matrix substrates, are of great interest. Active matrix substrates are generally non-transparent Si layers in which a transistor circuit has been processed under each light-emitting pixel.

If electrodes according to the invention are used in inverted OLEDs, the second layer is generally first applied to the emitter layer, as already described above, and then once this second layer has solidified, the first layer is applied to the emitter layer, as already described above.

Suitable emitter materials and materials for metal cathodes are those which are commonly used for electro-optical structures and are known to the person skilled in the art. Metal cathodes are preferably those made from metals having a low work function, such as Mg, Ca, Ba, Cs, or metal salts such as LiF. Conjugated polymers such as polyphenylene vinylenes or polyfluorenes or emitters from the class of low-molecular-weight emitters, also known in professional circles as "small molecules", such as tris(8-hydroxyquinolinato)aluminium (Alq$_3$), are preferably used as emitter materials.

In electro-optical structures the electrode according to the invention has a number of advantages over known electrodes:

a) In OLEDs and OSCs, for example, there is no need for TCO layers, such as ITO for example, or thin metal layers.

b) In the case of flexible substrates, bending the substrate does not lead to cracks in the brittle TCO layers and a failure of the electro-optical structure, since these polymeric layers are very ductile and flexible.

c) Organic layers are simpler to structure than inorganic layers, such as ITO for example. Organic layers can be removed again with solvents, by optical irradiation (UV) or by thermal irradiation (laser ablation).

The double-layer electrode according to the invention comprising a first and second layer also shows clear advantages over known polymer electrodes. In particular, thanks to the fine particle structure and low surface roughness, the short-circuit probability for OLEDs and OSCs is reduced considerably with the electrodes according to the invention. The significantly increased conductivity of the first electrode layer is also surprising, since it is known from the literature that reducing the particle size increases the surface resistance of resulting layers (A. Elschner et al., Asia Display IDW 2001, OEL 3-3, p. 1429). Even adding conductivity-increasing additives should not be expected to compensate for this negative influence of particle refinement on conductivity, let alone further increase the conductivity. The electroluminescence efficiency in OLEDs can be increased significantly through the use of the electrodes according to the invention. In particular, using the electrodes according to the invention in accordance with the particularly preferred embodiments, wherein both the first and the second electrode layer contains PEDT:PSA, an increase in electroluminescence efficiency of 1 to 3 orders of magnitude can be achieved as compared with single-layer electrodes with the same device current.

The effect obtained is unexpected, since in both layers the only electrically active component is the electrically conductive polythiophene, whereas the polymeric anions are electrically inert and primarily serve to keep the electrically conductive polymer or polythiophene in solution during polymerisation and the conductivity-increasing additives substantially volatise at drying temperatures of over 120° C.

To keep the voltage drop between the anode contact point and the OLED anode especially low, highly conductive leads made from metals, for example, and known as busbars can be used.

Figure 1:
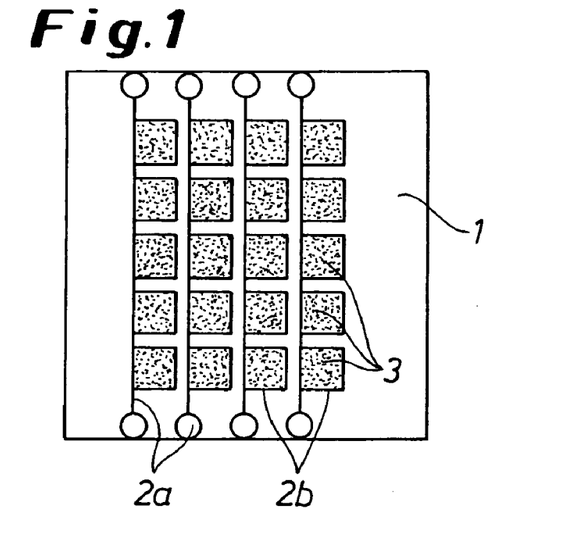
FIG. 1 is a schematic representation of a portion of an OLED display in accordance with one embodiment of the present invention.

In the case of passive matrix OLED displays, ITO address lines can be dispensed with on account of the invention. In their place, metal leads (busbars) in combination with the electrode according to the invention carry out anode-side addressing (see FIG. 1). Electrical leads 2a and pixel frames 2b with high conductivity are applied to a transparent support 1, e.g. a glass plate. They could be applied for example by vapour deposition of metals or inexpensively by printing with metal pastes. The polymeric electrode layer 3 is then deposited into the frames. An adhesion promoter is optionally applied first, then the first electrode layer and finally the second electrode layer. These layers are preferably applied by spin coating, printing and inkjet printing. The remaining structure corresponds to that of a standard passive matrix OLED and is known to the person skilled in the art.

Figure 2:
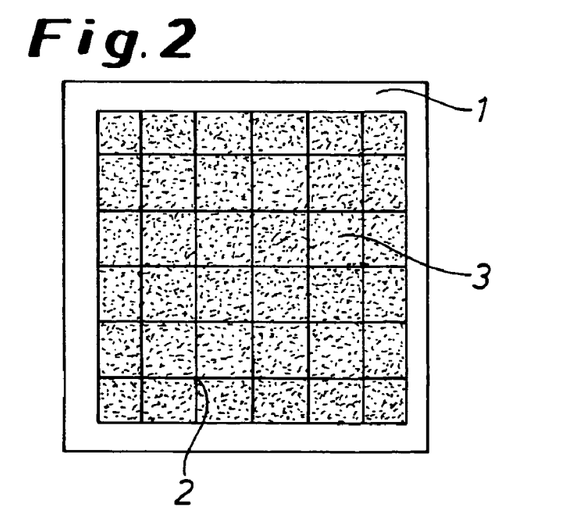
FIG. 2 is a schematic representation of a portion of an OLED display in accordance with another embodiment of the present invention.

In the case of homogeneously illuminating OLEDs (OLED lamps), ITO electrodes can be dispensed with on account of the invention. In their place, metal leads (busbars) in combination with the electrode according to the invention assume the function of the full-surface anode (see FIG. 2). Electrical leads 2 with high conductivity are applied to a transparent support 1, e.g. a glass plate, in the manner described in the previous paragraph, for example. The polymeric electrode layer 3 is then deposited on top in the sequence described in the previous paragraph. The remaining structure corresponds to that of a standard OLED lamp.

The dispersions which are particularly suitable for producing the first electrode layer are likewise not known from the literature and are thus provided by the present invention.

The invention will now be described in further detail with reference to the following non-limiting examples.

EXAMPLES

Particle size distributions given below were determined with an analytical ultracentrifuge, as described in H.G. Müller; Progr. Colloid Polym. Sci. 127 (2004) 9-13.

The luminous transmittance is measured according to the wavelength in accordance with ASTM D 1003 and used to calculate the standard colour value Y in accordance with ASTM E308. For a completely transparent sample Y=100, for an opaque sample Y=0. In light engineering terms, Y(D65/10°) is understood to be the standard colour value calculated using the standard light type D65 observed at an angle of 10° (cf. ASTM E308). The transmittance is measured with a UV/VIS spectrometer (PerkinElmer 900 with photo-integrating sphere) with an uncoated glass substrate in the control beam path.

The viscosity of the solutions examined here is measured with a Haake RV 1 rheometer with thermostat. In the clean and dry measuring beakers 13.5 g±0.3 g of the solutions to be measured are weighed into the measuring slit and measured at a shear rate of 100 s$^{-1}$ at 20.0° C.

The conductivity is understood to be the reciprocal of the specific resistance. This is calculated from the product of the surface resistance and film thickness of the conductive polymer layer. The surface resistance for conductive polymers is measured in accordance with DIN EN ISO 3915, the thickness of the polymer layer using a stylus profilometer.

The surface roughness Ra is measured using a scanning force microscope (Digital Instruments) by scanning a 1 µm by 1 µm area of an approx. 150 nm thick polymer layer on glass substrates.

Example 1

Production of a PEDT:PSA Dispersion for Producing the First Electrode Layer:

a) (According to the invention) In a commercially obtainable aqueous polyethylenedioxythiophene/polystyrene sulfonic acid dispersion (PEDT:PSA dispersion) with a polyethylenedioxythiophene/polystyrene acid weight ratio of 1:2.5, a solids content of approx. 1 wt. % and a viscosity of approx. 300 mPas at a shear rate of 100 s$^{-1}$ and at 20° C. (Baytron® PHC V4 from H.C. Starck GmbH), a particle size distribution with a d50 value of 25 nm, i.e. 50 wt. % of the particles smaller than 25 nm, was established by homogenisation. The dispersion was then concentrated from approx. 1 wt. % to a solids content of 1.7 wt. %, filtered (Pall, pore size: 0.2 µm) and then mixed with 5 wt. % dimethyl sulfoxide (DMSO). The viscosity of this solution was approx. 45 mPas at a shear rate of 100 s$^{-1}$ and at 20° C.

b) (Comparative example) A commercially obtainable aqueous PEDT:PSA dispersion with a polyethylenedioxythiophene/polystyrene sulfonic acid weight ratio of 1:2.5, a solids content of approx. 1 wt. % and a viscosity of approx. 300 mPas at a shear rate of 100 s$^{-1}$ and at 20° C. (Baytron®

PHC V4 from H.C. Starck GmbH), having a particle size distribution with a d50 value of 243 nm, was filtered. Due to its coarse character, this dispersion could only be filtered through a 10 μm filter.

c) (Comparative example) A PEDT:PSA dispersion was produced as described in 1b) and then mixed with 5 wt. % dimethyl sulfoxide. This dispersion too could only be filtered through a 10 μm filter due to its coarse character.

Example 2

Production and Characterisation of a First Electrode Layer:

a) (According to the invention) Glass substrates were cut to a size of 50×50 mm$^2$, cleaned and activated for 15 minutes with UV/ozone. The dispersion from example 1a) was then distributed over the glass substrate by means of a spin coater at the specified spin speed and an acceleration of 500 rpm/sec for 30 seconds. Parallel silver contacts were vapour deposited using a shadow mask and the surface resistance was determined. The film thickness was determined with a stylus profilometer (Tencor 500), the surface roughness with a scanning force microscope (Digital Instruments).

b) (Comparative example) Glass substrates were prepared as described in 2a), coated with a dispersion from example 1b) and their standard colour value, surface resistance, film thickness and surface roughness were determined.

c) (Comparative example) Glass substrates were prepared as described in 2a), coated with a dispersion from example 1c) and their standard colour value, surface resistance, film thickness and surface roughness were determined.

TABLE 1

Film thickness, conductivity, standard colour value and surface roughness of the first electrode layers from examples 2a), b) and c).

| Example | Spin speed [rpm] | Film thickness [nm] | Conductivity [S/cm] | Standard colour value Y(D65/10°) | Surface roughness Ra [nm] |
|---|---|---|---|---|---|
| 2a) | 950 | 129 | 621 | 89.1 | 1.39 |
| 2b) | 1250 | 146 | 56 | 86.9 | 1.93 |
| 2c) | 1200 | 158 | 601 | 85.3 | 3.53 |

The comparison of the first electrode layers from examples 2a) to 2c) shows that with comparable film thickness and standard colour value, the conductivity of the first electrode layer from example 2a) is the highest and at the same time the surface roughness is the lowest.

Example 3

Production of an OLED without a Second Electrode Layer

1. Substrates with Metallic Fingers:

Glass substrates were cut to a size of 50×50 mm$^2$ and cleaned. Then metal fingers in silver were vapour deposited onto the substrate using a shadow mask. The parallel metal lines with a width of 1 mm and a distance of 5 mm apart were connected by means of a central bar running perpendicular to them and had a height of 170 nm. Immediately before coating, the substrate surfaces were cleaned and activated with UV/ozone (UVP Inc., PR-100) for 15 minutes.

2. Application of a First Electrode Layer Using a PEDT:PSA Dispersion According to the Invention:

Approx. 2 ml of the dispersion from example 1a) were poured onto the substrate and then distributed on the glass substrate with the metal fingers using a spin coater at 1000 rpm and an acceleration of 500 rpm/sec for 30 seconds. The substrate with the still wet electrode layer was then placed on a hot plate, covered with a Petri dish and dried for 5 minutes at 200° C. The electrode layer was approx. 170 nm thick and had an electrical conductivity of 356 S/cm.

3. Application of the Emitter Layer:

Approx. 2 ml of a 1 wt. % xylene solution of the emitter Green 1300 LUMATION™—also abbreviated hereafter to DGP—(Dow Chemical Company) were filtered (Millipore HV, 0.45 μm) and distributed on the dried first electrode layer. The supernatant solution of the emitter was spun off by rotating the disc at 500 rpm and an acceleration of 200 rpm/sec for 30 seconds. The substrate coated in this way was then dried on a hot plate for 5 minutes at 110° C. The overall coating thickness was 250 nm.

4. Application of the Metal Cathodes:

Metal electrodes were vapour deposited onto the emitter layer. The vapour deposition system (Edwards) used for this step is built into an inert gas glove box (Braun). The substrate was placed on a shadow mask with the emitter layer underneath. The holes in the mask had a diameter of 2.0 mm and were a distance of 5.0 mm apart. The mask was positioned such that the holes were exactly between the metal fingers. Under a pressure of p=10$^{-3}$ Pa, a 5 nm thick Ba layer followed by a 200 nm Ag layer were vapour deposited one after the other from two vapour deposition boats. The vapour deposition rates were 10 Å/sec for Ba and 20 Å/sec for Ag.

5. Characterisation of the OLEDs:

For electro-optical characterisation the two electrodes of the OLED were connected to a voltage source via electrical leads. The positive pole was connected to the metal fingers, the negative pole to one of the vapour-deposited round metal electrodes.

The dependence of the OLED current and electroluminescence intensity (EL) on the voltage was recorded (Keithley 2400 current/voltage source). The EL was detected with a photodiode (EG&G C30809E) with an electrometer connected to it (Keithley 6514) and the luminance calibrated with a luminance meter (Minolta LS-100).

Example 4

Production of an OLED According to the Invention with a First and Second Electrode Layer:

This was performed as in example 3, with the difference that between step 2 and 3 a second electrode layer consisting of PEDT:PSA was applied. To this end 2 ml of an aqueous PEDT:PSA dispersion (Baytron® P CH8000 from H.C. Starck GmbH, PEDT:PSA weight ratio 1:20, solids content approx. 2.5 wt. %, viscosity approx. 12 mPas at 700 s$^{-1}$ at 20° C.), which had first been filtered (Millipore HV, 0.45 μm), were distributed onto the dried first electrode layer with a spin coater at 1000 rpm and an acceleration of 200 rpm/sec for 30 seconds. The substrate with the still wet second electrode layer was then placed on a hot plate, covered with a Petri dish and dried for 5 minutes at 200° C. The two electrode layers together had a film thickness of 270 nm.

TABLE 2

OLED current I, luminance L and efficiency η of the OLEDs from example 3 and 4

| | 4 V | | | 8 V | | |
|---|---|---|---|---|---|---|
| | I [mA/cm$^2$] | L [cd/m$^2$] | η [cd/A] | I [mA/cm$^2$] | L [cd/m$^2$] | η [cd/A] |
| Example 3 | 18.9 | 660 | 3.48 | 503.2 | 20148 | 4.00 |
| Example 4 | 7.0 | 19 | 0.27 | 385.4 | 7230 | 1.88 |

The comparison shows that in the relevant voltage range the OLED according to the invention from example 4 with the two-layer electrode surprisingly has a markedly higher luminance L and efficiency η than the OLED from example 3 with the only one-layer electrode.

Comparative Example 5

This was performed as described in example 3, with the following difference in the film thicknesses:
Device Structure:
Metal fingers//first electrode layer (75 nm)//DGP (80 nm)//Ba//Ag Example 6

According to the Invention

This was performed as described in example 4, with the following difference in the film thicknesses:
Device Structure:
Metal fingers//first electrode layer (75 nm)//second electrode layer (80 nm)//DGP (80 nm)//Ba//Ag Comparative Example 7

This was performed as in example 5, with the following difference: instead of the dispersion from example 1a), a dispersion from example 1b) is used to produce the first electrode layer.
Device Structure:
Metal fingers//first electrode layer (80 nm)//DGP (80 nm)//Ba//Ag Comparative Example 8

This was performed as in example 6, with the following difference: instead of the dispersion from example 1a), a dispersion from example 1b) is used to produce the first electrode layer.
Device Structure:
Metal fingers//first electrode layer (80 nm)//second electrode layer (80 nm)//DGP (80 nm)//Ba//Ag The characterisation of the OLEDs took place as described in examples 3 and 4.

TABLE 3

OLED current I, luminance L and efficiency η of the OLEDs from Ex. 5-8:

| | 4 V | | | | 8 V | | | |
|---|---|---|---|---|---|---|---|---|
| | I [mA/cm$^2$] | L [cd/m$^2$] | η [cd/A] | I+/I− | I [mA/cm$^2$] | L [cd/m$^2$] | η [cd/A] | I+/I− |
| Ex. 5 | 28.6 | 128 | 0.45 | 1.40E+01 | 524.5 | 9052 | 1.73 | 1.84E+01 |
| Ex. 6 | 21.4 | 1300 | 6.07 | 3.50E+05 | 477.6 | 25730 | 5.39 | 7.09E+04 |
| Ex. 7 | 17.1 | 138 | 0.80 | 4.20E+00 | 500.0 | 18600 | 3.72 | 7.42E+00 |
| Ex. 8 | 25.7 | 1628 | 6.33 | 4.20E+01 | 383.7 | 21700 | 5.66 | 1.88E+01 |

The comparison again shows that in the relevant voltage range the OLED according to the invention from example 6 with the two-layer electrode surprisingly has a markedly higher luminance L and efficiency 7 than the OLEDs from comparative examples 5 and 7 with the only one-layer electrode. In addition, the comparison shows that the OLED according to the invention from example 6 with the two-layer electrode produced with the dispersion according to the invention has a very much higher rectification ratio (I+/I−) than the OLED with the two-layer electrode from comparative example 8.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

What is claimed is:
1. A dispersion comprising at least one polymeric anion, at least one solvent and at least one polythiophene having repeating units corresponding to the general formula (I):

wherein A in each repeating unit independently represents a substituted or unsubstituted $C_1$ to $C_5$ alkylene radical, each R independently represents a linear or branched, substituted or unsubstituted $C_1$ to $C_{18}$ alkyl radical, a substituted or unsubstituted $C_5$ to $C_{12}$ cycloalkyl radical, a substituted or unsubstituted $C_6$ to $C_{14}$ aryl radical, a substituted or unsubstituted $C_7$ to $C_{18}$ aralkyl radical, a substituted or unsubstituted $C_1$ to $C_4$ hydroxyalkyl radical or a hydroxyl radical, x in each repeating unit independently represents a whole number from 0 to 8,
wherein the at least one polymeric anion and the at least one polythiophene are present in a weight ratio of 1:1 to 5:1, wherein the dispersion has a viscosity of 5 to 300 mPas, and wherein 50 wt. % of particles in the dispersion are smaller than 50 nm, such that a film produced from the dispersion has an electrical conductivity of at least 300 S/cm and a surface roughness Ra of less than 2.5 nm.
2. The dispersion according to claim 1, further comprising one or more additives selected from the group consisting of ether group-containing compounds, lactone group-containing compounds, amide group-containing compounds, lactam group-containing compounds, sulfones, sulfoxides, sugars, sugar derivatives, sugar alcohols, furan derivatives, dialcohols, polyalcohols and mixtures thereof, wherein the one or more additives is present in an amount of at least 0.1 wt. %, based on the dispersion.
3. A dispersion comprising at least one polymeric anion, at least one solvent and at least one polythiophene having repeating units corresponding to the general formula (I):

(II-a)

(II-b)

wherein A in each repeating unit independently represents a substituted or unsubstituted $C_1$ to $C_5$ alkylene radical, each R independently represents a linear or branched, substituted or unsubstituted $C_1$ to $C_{18}$ alkyl radical, a substituted or unsubstituted $C_5$ to $C_{12}$ cycloalkyl radical, a substituted or unsubstituted $C_6$ to $C_{14}$ aryl radical, a substituted or unsubstituted $C_7$ to $C_{18}$ aralkyl radical, a substituted or unsubstituted $C_1$ to $C_4$ hydroxyalkyl radical or a hydroxyl radical, x in each repeating unit independently represents a whole number from 0 to 8, wherein the at least one polymeric anion and the at least one polythiophene are present in a weight ratio of 1:1 to 5:1, wherein the dispersion has a viscosity of 5 to 300 mPas, and wherein 50 wt. % of particles in the dispersion are smaller than 30 nm, such that a film produced from the dispersion has an electrical conductivity of at least 300 S/cm and a surface roughness Ra of less than 2.5 nm.

4. The dispersion according to claim 3, further comprising one or more additives selected from the group consisting of ether group-containing compounds, lactone group-containing compounds, amide group-containing compounds, lactam group-containing compounds, sulfones, sulfoxides, sugars, sugar derivatives, sugar alcohols, furan derivatives, dialcohols, polyalcohols and mixtures thereof, wherein the one or more additives is present in an amount of at least 0.1 wt. %, based on the dispersion.

* * * * *